United States Patent [19]

Abdoulin et al.

[11] 4,416,708
[45] Nov. 22, 1983

[54] METHOD OF MANUFACTURE OF HIGH SPEED, HIGH POWER BIPOLAR TRANSISTOR

[75] Inventors: Edgar Abdoulin, Van Nuys; Alexander Lidow, Manhattan Beach, both of Calif.

[73] Assignee: International Rectifier Corporation, Los Angeles, Calif.

[21] Appl. No.: 339,672

[22] Filed: Jan. 15, 1982

[51] Int. Cl.³ .............................................. H01L 21/22
[52] U.S. Cl. ...................................... 148/187; 29/578
[58] Field of Search ........................... 148/187; 29/578

[56] References Cited

U.S. PATENT DOCUMENTS

| | | | |
|---|---|---|---|
| 3,807,038 | 4/1974 | Watari et al. | 29/578 |
| 3,839,104 | 10/1974 | Yuan | 148/187 X |
| 3,976,512 | 8/1976 | De Nora et al. | 29/578 X |
| 4,115,797 | 9/1978 | Hingarh et al. | 148/187 X |
| 4,263,066 | 4/1981 | Kolmann | 148/187 |
| 4,293,868 | 10/1981 | Iizuka et al. | 148/187 |

*Primary Examiner*—G. Ozaki
*Attorney, Agent, or Firm*—Ostrolenk, Faber, Gerb & Soffen

[57] ABSTRACT

A high speed, high power bipolar transistor has a planar emitter structure having a central area and outer peripheral areas. The doping concentration in the central area is reduced as compared to that of the outer areas to reduce the injection efficiency at the central area of the emitter region. A low doped region of conductivity type opposite to that of the emitter surrounds the emitter area and can fully deplete to spread out the field to permit high voltage breakdown for the device. A novel process of manufacture is used wherein the doping concentration across the emitter area is controlled by diffusing the emitter through a pattern of elongated or rectangular or other cross-section masking islands which have closer spacing in the center of the emitter region to produce a lower average doping concentration in the center of the emitter than in the outer peripheral regions of the emitter.

11 Claims, 8 Drawing Figures

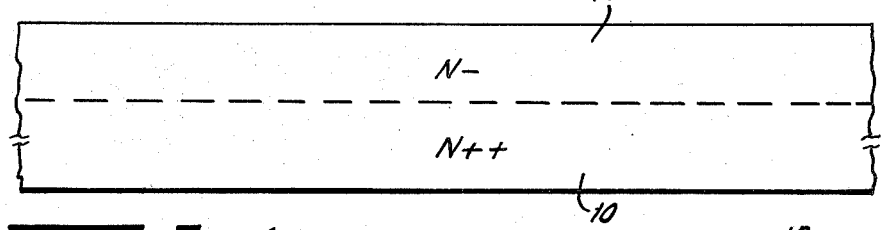
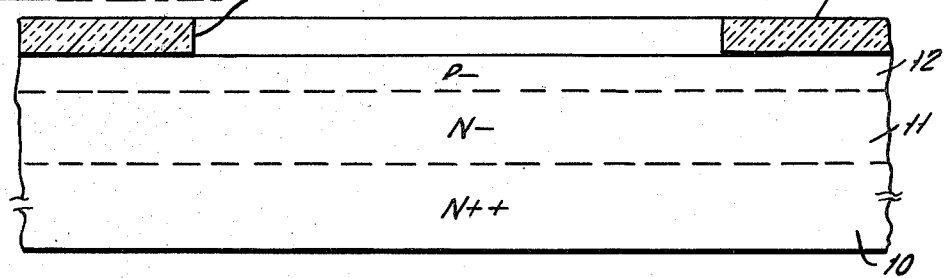
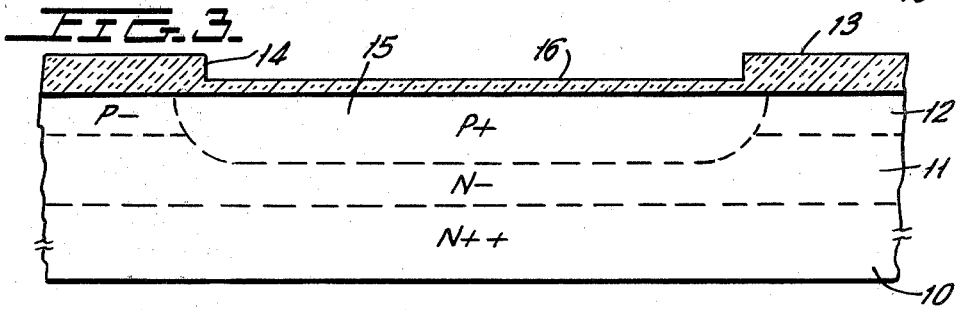
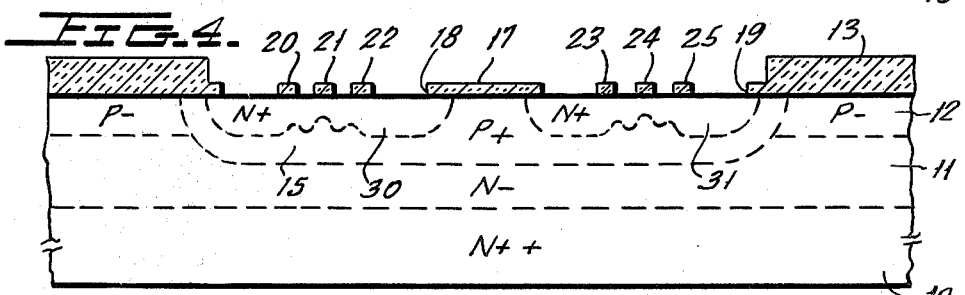
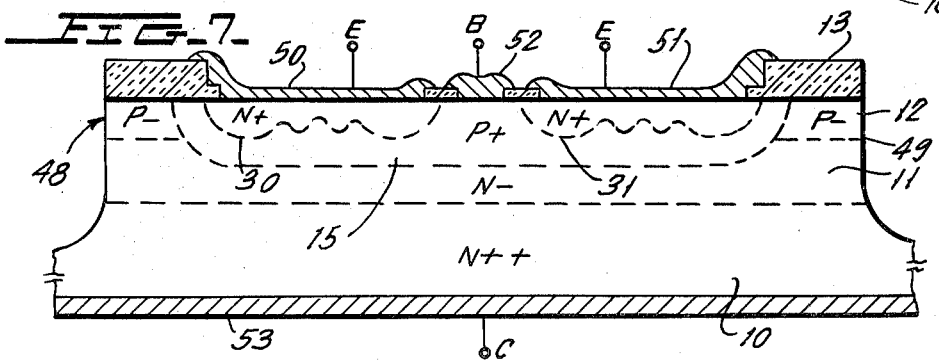

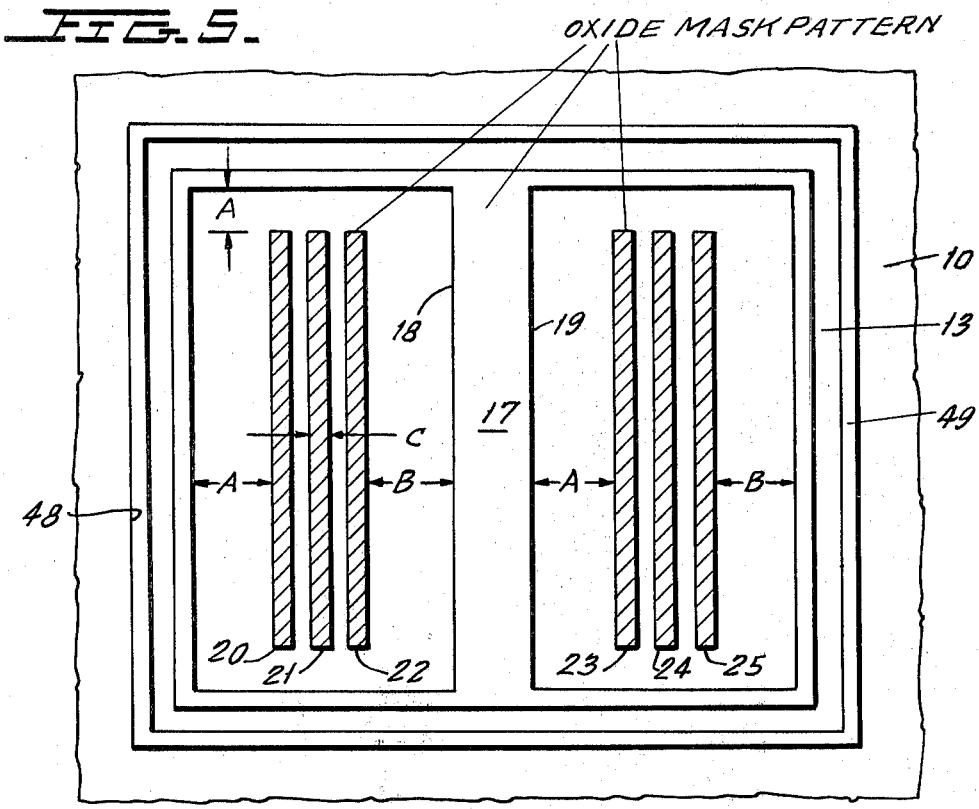
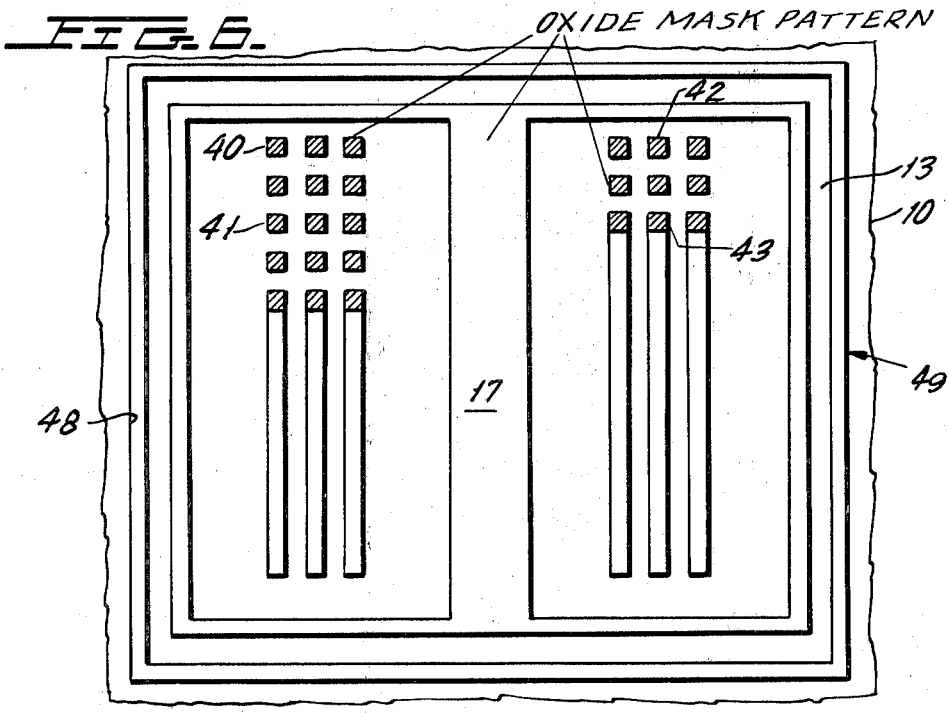

METHOD OF MANUFACTURE OF HIGH SPEED, HIGH POWER BIPOLAR TRANSISTOR

BACKGROUND OF THE INVENTION

This invention relates to high power, high speed bipolar transistors, and more specifically relates to a novel planar emitter pattern and a novel process of manufacture therefor.

High speed bipolar transistors are well known and have application in any desired high switching speed application, such as for power inverters or the like. It is known that switching speed can be improved if the planar emitter area of a transistor has a shallow depth in its central portions and a greater depth in its outer periphery. In addition, the central shallow region of the emitter should have a higher doping concentration than the deeper, outer peripheral region. This geometry minimizes the number of minority carriers injected beneath the emitter during turn on, which minority carriers are difficult to sweep out rapidly during turn off. Thus, switching speed will be increased.

The manufacturing process previously used to shape the emitter junction as discussed above, and to control its conductivity to have lower conductivity at its center than its outer rim, was complex and expensive. In addition, high speed switching transistors using the shaped planar emitter region described above have not had the highest possible voltage breakdown values because the field beneath the emitter does not spread out over the full area of the device under high blocking voltage.

Prior art shaped emitter structures of the type discussed above are shown in a paper entitled A NEW POWER TRANSISTOR STRUCTURE FOR IMPROVED SWITCHING PERFORMANCES by K. Owyang and P. Shafer, which was delivered at the International Electron Devices Meeting of the I.E.E.E. in 1978.

BRIEF DESCRIPTION OF THE INVENTION

A novel process is provided for forming the contoured emitter junction described above, which uses a minimum number of steps while improving the control of the concentration of impurities over the emitter area. In particular, and in accordance with the invention, a masking layer is formed over the surface of the emitter region before the emitter region is formed. The masking layer consists of spaced islands which are close to one another in the center of the emitter region but are widely spaced or define an opening around the periphery of the emitter area. Diffusion of impurities through this mask forms a deep, relatively highly concentrated planar diffusion around the periphery of the masking layer, but the diffusion of impurities in the central regions where the masking islands are closely spaced has a reduced average concentration. Preferably, the islands, which may have a rectangular or a stripe shape in the central regions of the emitter area, will have a width less than twice the desired emitter diffusion depth. They may also be spaced apart by less than about twice the desired diffusion depth.

The device made by the process of the invention is a very rugged device having very high speed. Thus, the novel adjustment of impurity concentration over its lateral dimension reduces storage time of minority carriers, thereby permitting much faster operation. The emitter junction configuration beneath the closely spaced masking islands will not necessarily be physically more shallow than at the periphery, but will be generally erose, and will have the same effect on speed as the shallower region of the prior art.

The emitter region of the invention is contained within a planar base region. As a further feature of the invention, a lightly doped region surrounds the base region and is of a conductivity type opposite to that of the emitter region and extends to the outer periphery of the device. The function of this lightly doped region is to fully deplete under high reverse voltage conditions and thereby spread out the field over the full area of the device. In this manner, devices have been made with up to 1100 volts breakdown.

BRIEF DESCRIPTION OF THE DRAWINGS

FIG. 1 is a cross-sectional view of a wafer of silicon material which is to be processed in accordance with the present invention.

FIG. 2 illustrates the wafer of FIG. 1 after the implantation of a lightly doped P type impurity in the upper surface of the wafer and further shows the subsequent formation of an oxide coating and the forming of a diffusion window in the oxide coating.

FIG. 3 illustrates the wafer of FIG. 2 after the diffusion of a relatively deep P+ base region and the concomitant growth of an additional oxide coating over the upper surface of the window through which the base region is diffused.

FIG. 4 shows the wafer of FIG. 3 after the novel mask of the invention is cut in the oxide layer covering the emitter window.

FIG. 5 is a top view of the wafer of FIG. 4 to further illustrate the mask pattern of FIG. 4.

FIG. 6 shows an alternative pattern for the oxide mask of FIG. 4 wherein a mask takes the form of rectangular elements rather than stripes as in FIG. 5.

FIG. 7 is a cross-sectional view similar to FIG. 4 but shows the removal of certain portions of the mask and the application of electrodes to the finished device.

DETAILED DESCRIPTION OF THE DRAWINGS

Figure 8:
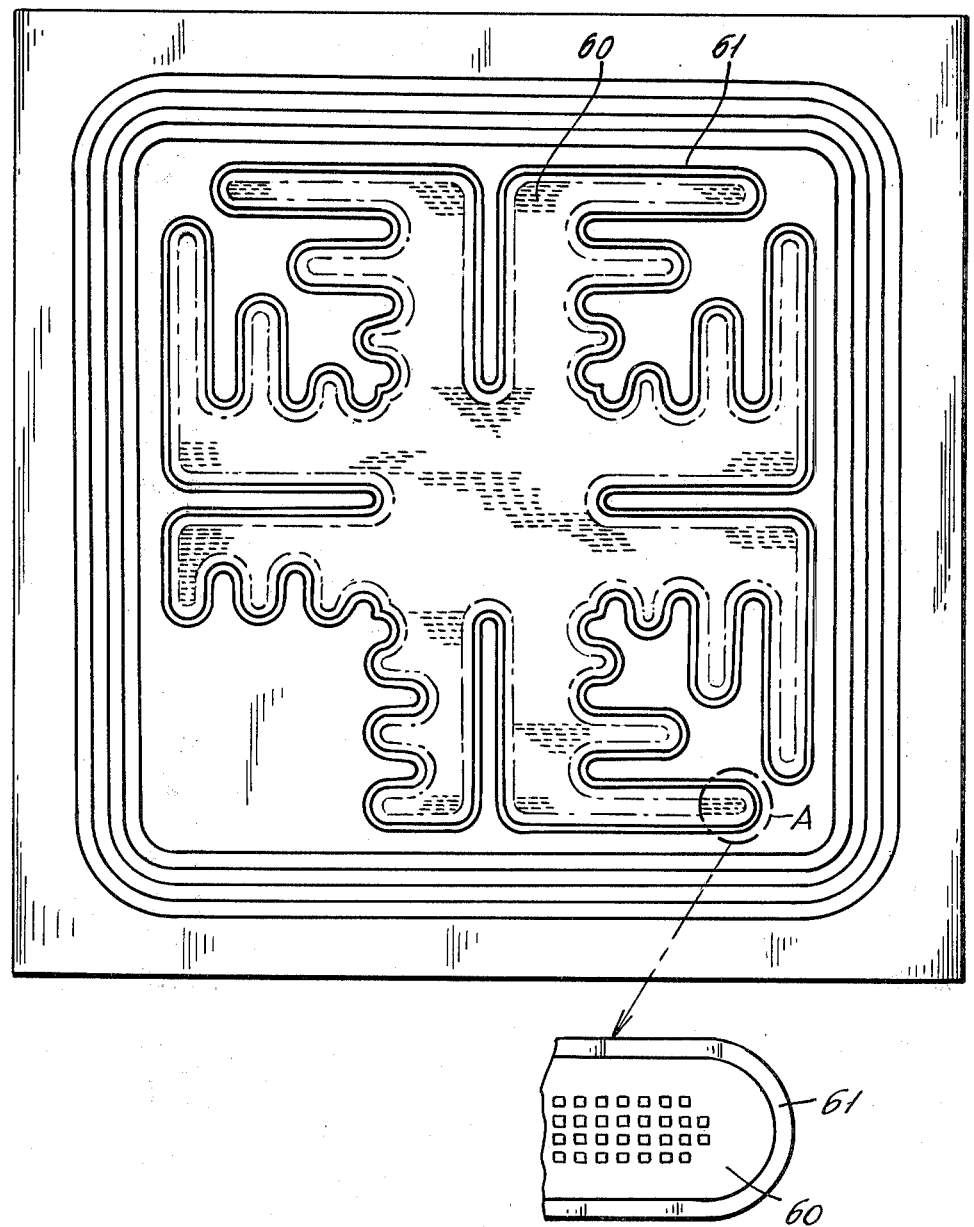
FIG. 8 is a top view of a second embodiment of the invention showing the formation of an island pattern over a very large area device.

Referring first to FIGS. 1 through 7, there is shown a portion of an enlarged wafer in various process steps, with FIG. 7 showing the completion of the wafer fabrication process. Only a single device is shown in FIGS. 1 to 7 but it will be understood that a large number of devices will be simultaneously fabricated on a common silicon wafer and that individual devices or chips ultimately will be broken away from one another and separately housed. Hereinafter, the terms "chip" and "wafer" are used interchangeably.

The beginning wafer is shown in FIG. 1 and can be a highly doped N++ wafer 10 which can have a thickness of 5 to 40 mils and can be a part of a circular wafer body having a diameter of 2 to 6 inches. A relatively thin N(−) region 11 is formed atop the highly doped region 10, where the N(−) region 11 can be an epitaxially deposited region having an impurity concentration of $1 \times 10^{14}$ atoms per cc of phosphorus atoms. Thereafter, and as shown in FIG. 2, a lightly doped P(−) region 12 is formed in the upper layer of the N(−) region 11. The P(−) region 12 can be formed by ion implantation or by any other desired technique. By way of example, when using ion implantation of boron ions, an impurity dose of $1 \times 10^{13}$ atoms per cc can be applied followed by a drive-in for approximately 150 minutes at 1200° C. Any desired technique can be used for forming the lightly doped P(−) region 12 wherein the P(−) region 12 will have a depth of from 4 to 15 microns.

In the above and in the foregoing, the invention is described in connection with a wafer having an N(−) region 11 beneath the P(−) region 12. It will be obvious to those skilled in the art that the conductivity types could be reversed and are chosen depending upon whether an NPN transistor or PNP transistor is to be made.

Following the deposition of the lightly doped P(−) region 12, an oxide layer or other suitable layer 13, which can later serve as a mask, is formed on the upper surface of the wafer. This oxide layer 13 can be grown during the drive of the implanted region 12, and is grown to a thickness of approximately 1.4 microns. Thereafter, suitable windows, such as rectangular window 14, shown in FIG. 2, are cut into the oxide layer 13 to define a diffusion window for a subsequent diffusion step.

The wafer with the mask shown in FIG. 2 is then placed in a diffusion furnace where a suitable P type impurity is diffused through the window 14 in order that the relatively deep P+ base region 15, shown in FIG. 3, is formed beneath the upper surface of the wafer. The P+ base 15 can be formed by any desired process step. In the example herein, P+ base 15 was formed by a conventional boron diffusion in a diffusion furnace held at a temperature of 1250° C. for approximately 15 hours. The depth of the high concentration P+ base diffusion 15 may be approximately 25 microns and is deeper than the surrounding P(−) region 12 as seen in FIG. 3.

During the diffusion process, an oxide layer 16 grows over the space exposed by the window 14 and grows, for example, to a thickness of about 1 micron. A suitable photolithographic mask is applied over the oxide layer 16 and over the other exposed surfaces of the oxide 13, with the mask having the configuration suitable to produce the oxide masking pattern shown in FIG. 5 and consisting of a wide oxide stripe 17 which defines a common side of two open windows 18 and 19 which contain pluralities of oxide stripes 20, 21 and 22, and 23, 24 and 25, respectively. Three stripes have been chosen within each window for convenience only and any desired number of stripes could have been chosen. The spacing between the adjacent stripes is approximately 10 microns. Preferably, the adjacent stripes are relatively close to one another, and should have a width less than twice the diffusion depth of the junction which is subsequently diffused through the closely spaced stripes, as will be later described.

The closely spaced stripes 20 through 22 and 23 through 25 are surrounded by an open frame area which consists of a relatively wide peripheral gap in the diffusion mask. These wide peripheral gaps are shown in FIG. 5 with the dimensions A and B. Dimensions A and B are approximately twice the spacing between adjacent stripes. The stripe width shown, for example, by dimension C in FIG. 5 is less than twice the desired diffusion depth of the transmitter region. In particular, dimensions A and B can be 25 microns when dimension C is 10 microns. Note also that the stripes 20 through 25 are shorter than the full height of the frames in which they are located. The closely spaced stripes may also be spaced apart by dimension C, although this spacing is not critical.

After forming the novel mask of FIGS. 4 and 5 in the oxide layer 16 which was formed during the diffusion of the base P+ region 15, the emitter of the transistor is formed by diffusion of an N type impurity through the mask. Thus, in FIGS. 4 to 7, two individual emitter regions 30 and 31 are formed wherein the regions, by virtue of the mask pattern, have relatively deep peripheral areas of relatively high impurity concentration and central areas of lower average impurity concentration and a generally shallower, erose shape. Since the phosphorus diffusion takes place in the center of the emitter regions through relatively closely spaced masking islands, the concentration of the phosphorus impurities at the center of the emitter is necessarily lower than at its periphery. Stated in other words, the percentage of the area which is masked in the center of the emitter region is greater than that at the periphery of the emitter region. Therefore, the emitter impurity concentration at the emitter periphery is greater than at its center.

Typically, the emitter diffusion process can consist of a phosphorus diffusion at 1200° C. for 4 hours, thereby producing N+ emitter regions 30 and 31 which have maximum peripheral depths of about 10 to 15 microns and an erose, central region. The width of the central, relatively low average conductivity region is about 3 mils while the width of the entire emitter 30 or 31 is about 5 mils (in FIG. 4).

During the operation of the device, the number of minority carriers injected beneath the emitter during turn-on will be minimized, thus substantially improving the switching time of the transistor. Note that the process steps used to the point of FIG. 4 are relatively simple and straightforward, although the relatively complex pattern for the emitters 30 and 31, which causes the improved high speed characteristics, is produced.

In FIGS. 4 and 5, the oxide masking pattern included closely spaced stripes which reduce the number of phosphorus impurity atoms which can reach the central areas of the emitter. Other patterns can be used for the individual oxide islands 20 through 25, while obtaining the same desired diffusion pattern for the emitter. For example, the stripes can be carried out in the form of dots or small rectangles such as those shown in FIG. 6 in place of the stripes 20 to 25. In FIG. 6, it will be observed that there are rows of individual rectangular oxide mask elements, such as the mask elements 40 and 41 in one row and the mask elements 42 an 43 in another row. The use of the rectangular islands will produce the same desired variation in emitter doping concentration as in FIG. 4.

Following the diffusion of the emitter regions 30 and 31, the central portions of the oxide mask are removed but sufficient oxide is left over the planar emitter junctions 30 and 31 so that the regions where these junctions reach the upper surface of the wafer will be conventionally passivated. Thereafter, emitter electrodes 50 and 51 are applied to emitter regions 30 and 31 and a base electrode 52 is applied to the P+ region which was formed beneath the oxide mask stripe 17 in FIG. 4.

A collector electrode 53 may then be placed on the bottom of the wafer. If desired, other configurations could be adopted wherein the collector region 11 is contacted at the same upper surface of the wafer which receives the emitter and base contacts 50, 51 and 52.

The invention can, of course, be carried out using any desired geometry for the emitter and using any number of individual spaced emitter regions other than the two shown in FIGS. 1 to 7. Thus, a single emitter region having the concentration distribution of region 30 could be used for a single device or any number greater than two emitter regions 30 and 31 could have been used.

Note that suitable isolation grooves such as the isolation grooves 48 and 49 (FIG. 7) can be formed in the wafer as desired during the process, and serve as the means to separate all of the individual transistor elements from one another in the main wafer in the manner well known to those skilled in the art.

FIG. 8 is a top view of a further embodiment of the invention wherein a very large emitter area is formed for a very high current power transistor. By way of example, in the device of FIG. 8, the chip area shown may be 160 mils by 160 mils. The product is formed by the process generally described in connection with FIGS. 1 to 7 but the emitter region 60 is a single, greatly enlarged area which is interdigitated with a very long base region 61. All of the central regions of the emitter which are removed from the boundary with the base are provided with a mask which may be of the general type shown in FIG. 5 or 6 as shown by the enlarged insert A.

Thus, FIG. 8, which shows the device prior to metallization, clearly illustrates that the novel invention is applicable to a wide range of geometries which can be used for any power transistor having a planar emitter structure.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. The process of manufacture of a high speed, high power transistor comprising the steps of:

forming a thin semiconductor body having flat, parallel first and second surfaces;

forming a relatively highly doped base region of one of the conductivity types in said first surface of said semiconductor body; said base region occupying a first area over said first surface and having a first depth beneath said first surface;

forming a diffusion mask over the exposed surface area of said base region; said mask including a plurality of spaced mask islands which are closely spaced to one another in laterally central areas of said base region and define a relatively large peripheral open-mask area which at least partly encloses said base region first area;

and diffusing a planar emitter region of the other of the conductivity types through said mask; the average doping concentration of said emitter region beneath said closely spaced islands being lower than the average doping concentration beneath said relatively large peripheral open-mask area.

2. The process of claim 1 wherein said base region is of the P type conductivity and said emitter region is of the N type conductivity.

3. The process of claim 1 wherein said spaced mask islands are parallel, spaced, elongated stripes.

4. The process of claim 1 wherein said spaced mask islands are discrete, square regions.

5. The process of claim 1 wherein said closely spaced mask islands have a width which is less than approximately twice the diffusion depth of said emitter region beneath said closely spaced islands.

6. The process of claim 1 wherein said large peripheral open-mask area has a width of at least about twice the distance between said closely spaced mask islands.

7. The process of claim 1 wherein a shallow, lightly doped region of said first conductivity type is formed in said first surface prior to the formation therein of said base region; said lightly doped region extending laterally beyond said surface of said base region.

8. The process of claim 2, 5, 6 or 7 wherein said spaced mask islands are parallel, spaced elongated stripes.

9. The process of claim 2, 5, 6 or 7 wherein said spaced mask islands are discrete, square regions.

10. The process of claim 6 wherein a shallow, lightly doped region of said one conductivity type is formed in said first surface prior to the formation therein of said base region; said lightly doped region extending laterally beyond said base region area.

11. The process of claim 1 which further includes the steps of stripping said mask from at least first and second regions of said first surface and overlying said emitter region and portions of the base region which were masked to prevent emitter diffusion therein respectively, and applying emitter and base contacts to said base and emitter regions respectively.

* * * * *